(12) United States Patent
Matsuura

(10) Patent No.: US 10,763,002 B2
(45) Date of Patent: Sep. 1, 2020

(54) SURFACE-TREATED COPPER FOIL, MANUFACTURING METHOD THEREFOR, PRINTED CIRCUIT BOARD COPPER-CLAD LAMINATE, AND PRINTED CIRCUIT BOARD

(71) Applicant: MITSUI MINING & SMELTING CO., LTD., Tokyo (JP)

(72) Inventor: Yoshinori Matsuura, Ageo (JP)

(73) Assignee: MITSUI MINING & SMELTING CO., LTD., Tokyo (JP)

( * ) Notice: Subject to any disclaimer, the term of this patent is extended or adjusted under 35 U.S.C. 154(b) by 0 days.

(21) Appl. No.: 15/567,166

(22) PCT Filed: Mar. 24, 2016

(86) PCT No.: PCT/JP2016/059464
§ 371 (c)(1),
(2) Date: Oct. 17, 2017

(87) PCT Pub. No.: WO2016/174970
PCT Pub. Date: Nov. 3, 2016

(65) Prior Publication Data
US 2018/0151268 A1 May 31, 2018

(30) Foreign Application Priority Data

Apr. 28, 2015 (JP) ................................. 2015-091191

(51) Int. Cl.
*H05K 1/03* (2006.01)
*H01B 1/02* (2006.01)
(Continued)

(52) U.S. Cl.
CPC ............. *H01B 1/026* (2013.01); *B32B 15/04* (2013.01); *C23C 14/06* (2013.01); *H01B 3/46* (2013.01);
(Continued)

(58) Field of Classification Search
CPC .. H01B 1/026; H01B 3/46; H01B 7/02; B32B 15/04; B32B 7/06; B32B 15/20;
(Continued)

(56) References Cited

U.S. PATENT DOCUMENTS 8,586,976 B2 * 11/2013 Matsuura ............ H01L 51/0096
257/100
8,803,135 B2 * 8/2014 Matsuura ............ H01L 51/5218
257/40
(Continued)

FOREIGN PATENT DOCUMENTS

CN 102089454 A 6/2011
CN 103199056 A 7/2013
(Continued)

OTHER PUBLICATIONS

International Search Report from Application No. PCT/JP2016/059464, dated Jun. 7, 2016.
(Continued)

*Primary Examiner* — Steven T Sawyer
(74) *Attorney, Agent, or Firm* — Greenblum & Bernstein, P.L.C.

(57) ABSTRACT

There is provided a copper foil having a surface coating layer that can achieve a high bonding strength to a resin layer even if the copper foil has an extremely smooth surface such as one formed by vapor deposition, for example, sputtering and also has a desirable insulation resistance suitable for achieving a fine pitch in a printed wiring board. A surface-treated copper foil according to the present invention includes a copper foil and a silicon-based surface coating layer provided on at least one surface of the copper foil, the silicon-based surface coating layer being mainly composed of silicon (Si). The silicon-based surface coating layer has a carbon content of 1.0 to 35.0 atomic % and an oxygen content of 12.0 to 40.0 atomic % relative to a total (Continued)

content in 100 atomic % of carbon (C), oxygen (O) and silicon (Si) elements as measured by X-ray photoelectron spectroscopy (XPS).

17 Claims, 5 Drawing Sheets

(51) Int. Cl.
| | |
|---|---|
| *C23C 14/06* | (2006.01) |
| *H05K 3/38* | (2006.01) |
| *H05K 3/02* | (2006.01) |
| *B32B 15/04* | (2006.01) |
| *H01B 3/46* | (2006.01) |
| *H01B 7/02* | (2006.01) |

(52) U.S. Cl.
CPC .............. *H01B 7/02* (2013.01); *H05K 1/0306* (2013.01); *H05K 1/036* (2013.01); *H05K 3/025* (2013.01); *H05K 3/388* (2013.01); *H05K 2201/0179* (2013.01); *H05K 2201/029* (2013.01)

(58) Field of Classification Search
CPC ............ B32B 17/061; B32B 2262/101; B32B 2264/101; B32B 2307/406; B32B 2307/5825; B32B 2307/732; B32B 2307/538; B32B 2457/08; B32B 2255/205; B32B 2255/20; B32B 2255/26; B32B 2255/28; B32B 2255/10; B32B 2260/021; B32B 2260/046; B32B 2260/028; B32B 27/42; B32B 27/20; B32B 27/38; B32B 27/28; B32B 27/285; B32B 2250/03; B32B 2250/04; B32B 5/022; B32B 5/024; B32B 27/08; B32B 29/005; H05K 1/0306; H05K 1/036; H05K 3/388; H05K 3/025; H05K 2201/029; H05K 2201/0179; H01L 31/026; C23C 14/06
See application file for complete search history.

(56) References Cited

U.S. PATENT DOCUMENTS

| | | | |
|---|---|---|---|
| 2004/0124531 A1* | 7/2004 | Venkatraman | .......... C23C 16/30 257/751 |
| 2005/0214551 A1 | 9/2005 | Aida | |
| 2009/0291371 A1* | 11/2009 | Konishiike | ........... H01M 4/134 429/338 |
| 2010/0279092 A1* | 11/2010 | Hwang | ................... B32B 15/04 428/213 |
| 2011/0148559 A1* | 6/2011 | Ikriannikov | .............. H01F 3/08 336/192 |
| 2013/0081865 A1* | 4/2013 | Mizuno | ................... B32B 15/04 174/258 |
| 2013/0175680 A1* | 7/2013 | Gates | ................ H01L 21/02126 257/734 |
| 2015/0284844 A1* | 10/2015 | Suzuki | .................. C23C 16/402 428/337 |
| 2016/0049609 A1* | 2/2016 | Ezure | .................. H01L 51/5253 428/446 |
| 2018/0219313 A1* | 8/2018 | Sauer | ................. H01R 12/7088 |

FOREIGN PATENT DOCUMENTS

| | | |
|---|---|---|
| JP | 05-279870 A | 10/1993 |
| JP | 2005-219258 A | 8/2005 |
| JP | 2007-098732 A | 4/2007 |
| JP | 2007-266416 A | 10/2007 |
| JP | 2008-198953 A | 8/2008 |
| JP | 2008-311328 A | 12/2008 |
| JP | 2010-201620 A | 9/2010 |
| JP | 2011-166018 A | 8/2011 |
| KR | 10-2015-0042124 | 4/2015 |
| WO | 2007/040196 A1 | 4/2007 |
| WO | 2008/099527 A1 | 8/2008 |

OTHER PUBLICATIONS

Written Opinion of the International Search Authority from Application No. PCT/JP2016/059464, dated Jun. 7, 2016.
Office Action for Korean Patent Application No. 10-2017-7025492, dated Jul. 1, 2019 (w/ translation).
Office Action for CN App. No. 201680024855.5 dated Feb. 20, 2019 (w/ translation).

* cited by examiner

SURFACE-TREATED COPPER FOIL, MANUFACTURING METHOD THEREFOR, PRINTED CIRCUIT BOARD COPPER-CLAD LAMINATE, AND PRINTED CIRCUIT BOARD

TECHNICAL FIELD

The present invention relates to a surface-treated copper foil, a method for manufacturing the surface-treated copper foil, a copper-clad laminate for a printed wiring board, and a printed wiring board.

BACKGROUND ART

In recent years, downsizing and sophistication of electronic devices, such as portable electronic devices, demand printed wiring boards having further miniaturized (fine-pitched) wiring patterns. To meet such a requirement, a copper foil for manufacturing a printed wiring board is desired to have a smaller thickness and a lower surface roughness than current ones.

The copper foil for manufacturing a printed wiring board is used in lamination to an insulating resin substrate. It is important to ensure bonding strength between the copper foil and the insulating resin substrate because low bonding strength may cause traces to separate during manufacturing the printed wiring board, resulting in a low product yield. In this regard, usual copper foil for manufacturing printed wiring boards is subjected to a roughening treatment to form asperities on the surface to be bonded. The asperities are pressed to bite into the insulating resin substrate to exhibit an anchoring effect, resulting in improved adhesion. This technique involving the roughening treatment is, however, incompatible with the above-described copper foil aimed to meet the fine pitch and having a smaller thickness and a lower surface roughness than conventional ones.

A copper foil for a printed wiring board to improve the adhesion between the copper foil and the insulating resin substrate without roughening treatment is known. For example, Patent Document 1 (JP2007-266416A) discloses a metal foil having a surface roughness Rz of 2.5 μm or less on at least one side thereof, wherein at least Si oxide (such as $SiO_2$) sites are scattered about and exposed on the one side. The metal foil actually used in this document is a rolled copper foil having a thickness of 18 μm and a surface roughness Rz of 0.7 μm on both sides.

CITATION LIST

Patent Documents

Patent Document 1: JP2007-266416A

SUMMARY OF INVENTION

Patent document 1 describes that a conductor circuit of a fine pattern can be formed on a metal foil-clad laminate by etching treatment, which increases peel strength between the metal foil and the insulating base material. However, in this document, line/space (L/S) as a fine pitch is assumed to be at least about 25 μm/25 μm or larger. In contrast, recently, it has been desired to form a wiring pattern with a highly miniaturized line/space (L/S) of as thin as (13 μm or less)/(13 μm or less) (e.g., 12 μm/12 μm, 10 μm/10 μm, 5 μm/5 μm, and 2 μm/2 μm). It is thus desirable to use an extremely thin copper foil having a thickness smaller than ever before (for example, 1 μm or less). Such an extremely thin copper foil manufactured by an electrolytic deposition technique, however, is likely to have problems, such as pinhole formation due to the excessively small thickness. Another disclosed technique for manufacturing an extremely thin copper foil having a thickness of 3 μm or less involves sputtering instead of the conventional electrolytic deposition. The resulting extremely thin copper foil, however, is not expected to have the anchoring effect based on asperities on the copper foil surface because of its extremely smooth surface (e.g., arithmetic mean roughness Ra: 200 nm or less). Thus, it has been difficult to ensure the high bonding strength between such an extremely thin copper foil and the resin layer. Furthermore, it is also desired to effectively prevent or reduce the leakage current among interconnections in the highly fine-pitched wiring pattern in printed wiring boards.

The present inventors have currently found that forming a silicon-based surface coating layer incorporated with carbon and oxygen at a predetermined content on at least one surface of a copper foil can provide a copper foil having a surface coating layer that can achieve a high bonding strength to a resin layer even if the copper foil has an extremely smooth surface such as one formed by vapor deposition, for example, sputtering and also has a desirable insulation resistance suitable for achieving a fine pitch in a printed wiring board.

Accordingly, it is an object of the present invention to provide a copper foil having a surface coating layer that can achieve a high bonding strength to a resin layer even if the copper foil has an extremely smooth surface such as one formed by vapor deposition, for example, sputtering and also has a desirable insulation resistance suitable for achieving a fine pitch in a printed wiring board.

According to a first aspect of the present invention, there is provided a surface-treated copper foil including a copper foil and a silicon-based surface coating layer provided on a least one surface of the copper foil, the silicon-based surface coating layer being mainly composed of silicon (Si) and having a carbon content of 1.0 to 35.0 atomic % and an oxygen content of 12.0 to 40.0 atomic % relative to a total content in 100 atomic % of the carbon (C), oxygen (O) and silicon (Si) elements as measured by X-ray photoelectron spectroscopy (XPS).

According to a second aspect of the present invention, there is provided a copper-clad laminate for a printed wiring board provided with the surface-treated copper foil according to the first aspect and a resin layer provided in close contact with the silicon-based surface coating layer.

According to a third aspect of the present invention, there is provided a printed wiring board including a laminated layer structure including, in sequence, a resin layer, a silicon-based surface coating layer being mainly composed of silicon (Si) and having a carbon content of 1.0 to 35.0 atomic % and an oxygen content of 12.0 to 40.0 atomic % relative to a total content in 100 atomic % of the carbon (C), oxygen (O) and silicon (Si) elements as measured by X-ray photoelectron spectroscopy (XPS), and a copper layer.

According to a fourth aspect of the present invention, there is provided a method for manufacturing a surface-treated copper foil according to the above aspects, including the steps of providing a copper foil and forming a silicon-based surface coating layer being mainly composed of silicon (Si) and having a carbon content of 1.0 to 35.0 atomic % and an oxygen content of 12.0 to 40.0 atomic % relative to a total content in 100 atomic % of the carbon (C), oxygen (O) and silicon (Si) elements as measured by X-ray photoelectron spectroscopy (XPS) on at least one surface of the copper foil by vapor deposition.

DESCRIPTION OF EMBODIMENT

Surface-Treated Copper Foil

Figure 1:
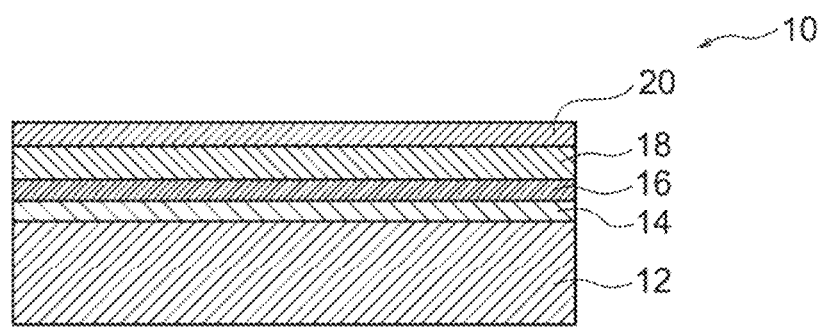
FIG. 1 is a schematic cross-sectional view illustrating one aspect of a copper foil provided with a carrier containing a surface-treated copper foil according to the present invention.

A surface-treated copper foil according to the present invention includes a copper foil and a silicon-based surface coating layer provided on at least one surface of the copper foil. Optionally, the silicon-based surface coating layer may be provided on both surfaces of the copper foil. The silicon-based surface coating layer is mainly composed of silicon (Si) and has a carbon content of 1.0 to 35.0 atomic % and an oxygen content of 12.0 to 40.0 atomic % relative to a total content in 100 atomic % of the carbon (C), oxygen (O) and silicon (Si) elements as measured by X-ray photoelectron spectroscopy (XPS). The resulting silicon-based surface coating layer containing carbon and oxygen at predetermined contents can provide a copper foil provided with a surface coating layer that can achieve a high bonding strength to a resin layer, even if the copper foil has an extremely smooth surface such as one formed by vapor deposition, for example, sputtering, and also has a desirable insulation resistance suitable for achieving a fine pitch in a printed wiring board.

As described above, for the formation of a highly miniaturized wiring pattern having such a fine line/space (US) of (13 µm or less)/(13 µm or less) (e.g., 12 µm/12 µm, 10 µm/10 µm, 5 µm/5 µm, 2 µm/2 µm), it is desired to use an extremely thin copper foil having a thickness smaller than ever before (for example, 1 µm or less). Such an extremely thin copper foil manufactured by an electrolytic deposition technique, however, is likely to have problems, such as pinhole formation due to the excessively small thickness. Another disclosed technique for manufacturing an extremely thin copper foil having a thickness of 3 µm or less involves sputtering instead of the conventional electrolytic deposition. The resulting extremely thin copper foil, however, is not expected to have the anchoring effect based on asperities on the copper foil surface because of its extremely smooth surface (e.g., arithmetic mean roughness Ra: 200 nm or less). Thus, it has been difficult to ensure the high bonding strength between such an extremely thin copper foil and the resin layer. In this regard, the surface-treated copper foil according to the present invention can have the improved adhesion to the resin layer by a chemical technique controlling the composition of the surface coating layer instead of a physical technique such as the anchoring effect for the conventional extremely thin copper foil. Thus, a silicon-based surface coating layer being mainly composed of silicon (Si) and having a carbon content of 1.0 to 35.0 atomic % and an oxygen content of 12.0 to 40.0 atomic % relative to a total content in 100 atomic % of the carbon (C), oxygen (O) and silicon (Si) elements as measured by X-ray photoelectron spectroscopy (XPS) is provided on at least one surface of the copper foil, and thereby can achieve a high bonding strength to a resin layer even if the copper foil has an extremely smooth surface such as one formed by vapor deposition, for example, sputtering. Furthermore, the silicon-based surface coating layer having the above composition can achieve a desirable insulation resistance suitable for a fine pitch in a printed wiring board to prevent or reduce the leakage current among interconnections in the fine-pitched wiring pattern.

Accordingly, the surface-treated copper foil of the present invention is preferably used for manufacturing a copper-clad laminate for a printed wiring board, wherein the manufacturing involves laminating a resin layer (typically, an insulating resin layer) on the silicon-based surface coating layer.

The copper foil constituting the surface-treated copper foil according to the present invention may be manufactured in any manner. In other words, the copper foil may be an electrodeposited copper foil or a rolled copper foil. Alternatively, in the case where the copper foil is provided with a carrier, the copper foil may be formed by a wet process, for example, electroless-copper plating or electro-copper plating; physical vapor deposition, for example, sputtering or vacuum vapor deposition; chemical vapor deposition; or combination thereof. Particularly preferred is a copper foil manufactured by physical vapor deposition, for example, sputtering or vacuum vapor deposition because the resulting copper foil is extremely thin (e.g., 3 µm or less) and is suitable to meet a fine pitch. The most preferred is a copper foil manufactured by sputtering deposition. The copper foil is preferably not roughened, but may be preliminary roughened or secondarily roughened by, soft etching, cleaning, or oxidation reduction if the wiring pattern can be formed without difficulty during the production of printed wiring boards. The copper foil may have any thickness. To meet the fine pitch described above, the thickness is in a range of preferably 50 to 3000 nm, more preferably 75 to 2000 nm, even more preferably 90 to 1500 nm, especially preferably 100 to 1000 nm, most preferably 100 to 700 nm, 150 to 800 nm, or 200 to 1000 nm. The copper foil having a thickness within such a range is preferably manufactured by sputtering deposition in view of uniformity of in-plane thickness of the foil and productivity in the form of a sheet or a roll.

The surface, adjacent to the silicon-based surface coating layer, of the copper foil constituting the surface-treated copper foil according to the present invention has an arithmetic mean roughness Ra (measured according to JIS B 0601-2001) of preferably 200 nm or less, more preferably 1 to 175 nm, even more preferably 2 to 180 nm, especially preferably 3 to 130 nm, most preferably 5 to 100 nm. Such a surface-treated copper foil having a smaller arithmetic mean roughness can form a highly miniaturized wiring pattern having such a fine line/space (L/S) of (13 µm or less)/(13 µm or less) (e.g., 12 µm/12 µm to 2 µm/2 µm) in the printed wiring board. Although such an extremely smooth copper foil surface is not expected to have the anchoring effect based on asperities on the copper foil surface, the surface-treated copper foil according to the present invention can achieve the improved adhesion to the resin layer by adopting a chemical technique controlling the composition of the silicon-based surface coating layer instead of a physical technique such as the anchoring effect described above. The arithmetic mean roughness Ra in the present invention is measured with a non-contact profilometer. Examples of the non-contact profilometer include NewView5032, manufactured by Zygo Corp.

As described above, the surface-treated copper foil according to the present invention may be provided in the form of a copper foil provided with a carrier. The handling of the extremely thin copper foil can be improved when used in the form of a copper foil provided with a carrier. In particular, a copper foil can be manufactured by vacuum vapor deposition such as sputtering desirably by adopting the form of the copper foil provided with a carrier. As shown in FIG. 1, the copper foil 10 provided with a carrier may include a carrier 12, a release layer 16, an extremely thin copper foil layer 18, and a silicon-based surface coating layer 20 in this order. A refractory metal layer 14 may be provided between the carrier 12 and the release layer 16. Furthermore, the copper foil 10 provided with a carrier may include these layers laminated symmetrically on the upper and lower surfaces of the carrier 12. The copper foil provided with a carrier can have any known layer configuration except that the extremely thin copper foil layer 18 and the silicon-based surface coating layer 20 are provided. Examples of the carrier include a metal foil such as a copper foil, a nickel foil, a stainless steel foil, and an aluminum foil; a resin film such as a PET film, a PEN film, an aramid film, a polyimide film, a nylon film, and a liquid crystal polymer; and a metal coated resin film composed of a metal coating layer on a resin film, preferably a copper foil. The copper foil as a carrier may be either a rolled copper foil or an electrodeposited copper foil. The carrier has a thickness of typically 210 µm or less, preferably in the range of 10 to 210 µm in view of transportability of the copper foil provided with a carrier and tear resistance at the time of separation of the carrier. Preferred examples of the metal constituting the refractory metal layer 14 include iron, nickel, titanium, tantalum, and tungsten. Particularly preferred is titanium. These metals have a high stability as an interdiffusion barrier under hot pressing conditions, for example. In particular, titanium exhibits excellent high-temperature resistance because its oxide forms a very strong passivated film. In this case, the titanium layer is preferably formed by a physical vapor deposition such as sputtering. The refractory metal layer 14 such as a titanium layer has a thickness of preferably 1 to 50 nm, more preferably 4 to 50 nm. The release layer 16 described above may be any of an organic, inorganic or carbon-based release layer. Examples of the organic component used for the organic release layer include a nitrogen-containing organic compound, a sulfur-containing organic compound, and a carboxylic acid. Examples of the nitrogen-containing organic compound include a triazole compound, an imidazole compound. Among them, a triazole compound is preferred in view of stabilized releasability. Examples of triazole compounds include 1,2,3-benzotriazole, carboxybenzotriazole, N',N'-bis (benzotriazolylmethyl) urea, 1H-1,2,4-triazole and 3-amino-1H-1,2,4-triazole. Examples of sulfur-containing organic compounds include mercaptobenzothiazole, thiocyanuric acid, and 2-benzimidazole thiol. Examples of carboxylic acids include monocarboxylic acids, and dicarboxylic acids. Examples of the inorganic component used for the inorganic release layer include at least any one of metal selected from the group consisting of Ni, Mo, Co, Cr, Fe, Ti, W, P, and Zn and metal oxides thereof. Exemplary carbon-based release layers include a carbon layer. Since interdiffusion and reactivity between carbon and a carrier is low, carbon can prevent formation of metal bonding at the interface to the copper foil layer even during hot pressing at higher than 300° C. to ensure easy separation or removal of the carrier. The carbon layer is also preferably formed by a physical vapor deposition such as sputtering. The thickness of the release layer is preferably from 0.5 to 500 nm, more preferably from 1 to 100 nm from the viewpoints of releasability and production efficiency. When the release layer is a carbon layer, the reduced thickness of the carbon layer is preferably from 1 to 20 nm. This thickness is measured by analyzing the cross section of the layer with an energy dispersive X-ray spectrometer of a transmission electron microscope (TEM-EDX).

The silicon-based surface coating layer constituting the surface-treated copper foil of the present invention is mainly composed of silicon (Si) and having a carbon content of 1.0 to 35.0 atomic % and an oxygen content of 12.0 to 40.0 atomic % relative to a total content in 100 atomic % of the carbon (C), oxygen (O) and silicon (Si) elements as measured by X-ray photoelectron spectroscopy (XPS). The silicon constituting the silicon-based surface coating layer is typically amorphous silicon. "Mainly composed of (comprising) silicon (Si)" means that the content of silicon atoms is higher than the carbon content and also higher than the oxygen content. The content of silicon atoms in the silicon-based surface coating layer is preferably 40 to 87 atomic %, more preferably 45 to 85 atomic %, and even more preferably 47 to 75 atomic % relative to a total content in 100 atomic % of the carbon (C), oxygen (O) and silicon (Si) elements as measured by X-ray photoelectron spectroscopy (XPS). The content within such a range can significantly enhance electrical insulation property and heat resistance of the amorphous silicon. In addition, the content of silicon atoms in the silicon-based surface coating layer, as measured with a radio frequency glow discharge optical emission surface analyzer (glow discharge spectroscopy: GDS), is preferably 40 to 87 atomic %, more preferably 43 to 86 atomic %, still more preferably from 45 to 75 atomic %, particularly preferably from 47 to 70 atomic %. Typically, carbon atoms and oxygen atoms in the silicon-based surface coating layer are bonded to silicon atoms. The silicon-based surface coating layer containing carbon and oxygen in the amount described above can achieve both of adhesion to the resin layer and insulation resistance. Furthermore, a silicon-based material constituting the silicon-based surface coating layer may contain incidental impurities introduced from raw material components or during film-forming process. For example, addition of a small amount of a conductive dopant such as boron to a DC sputtering target may involves mixing of a trace amount of such a dopant into the silicon-based surface coating layer. Such incidental impurities contamination can be tolerated. Furthermore, the silicon-based surface coating layer may contain other dopants and trace amounts of inevitable gas components, such as hydrogen and nitrogen, introduced by exposure to the atmosphere during film formation within the scope not departing from the gist of the present invention.

The silicon-based surface coating layer has a carbon content, as measured by XPS, of preferably 1.0 to 35.0 atomic %, more preferably 5.0 to 34.0 atomic %, particularly preferably 10.0 to 30.0 atomic %, most preferably 12.0 to 30.0 atomic % relative to a total content in 100 atomic % of the carbon (C), oxygen (O) and silicon (Si) elements. The silicon-based surface coating layer has an oxygen content, as measured by XPS, of preferably 12.0 to 40.0 atomic %, more preferably from 15.0 to 35.0 atomic %, still more preferably from 20.0 to 30.0 atomic %, most preferably 22.0 to 28.0 atomic %, relative to a total content in 100 atomic % of the carbon (C), oxygen (O) and silicon (Si) elements. The contents of the carbon and oxygen within such ranges can significantly enhance adhesion to the resin layer and insulation resistance. Although the mechanism is not clear, some amount of oxygen atoms present in the silicon-based surface coating layer contributes to insulation resistance, whereas too much amount of oxygen atoms may lower adhesion to the resin layer. Furthermore, carbon atoms also present to some extent in the silicon-based surface coating layer contribute to improvement of adhesion and insulation resistance.

The silicon content, carbon content and oxygen content in silicon-based surface coating layer can be measured by X-ray photoelectron spectroscopy (XPS) throughout the specification. More specifically, the contents can be respective percentages (atomic %) of O element and C element based on a total content in 100 atomic % of the three elements of Si, C and O detected by X-ray photoelectron spectroscopy (XPS). In this case, the silicon content (atomic %) is a value calculated according to the formula of 100×Si/(Si+C+O), the carbon content (atomic %) is a value calculated according to the formula of 100×C/(Si+C+0), and the oxygen content (atomic %) is a value calculated according to the formula of 100×O/(Si+C+O) (in these formulas, the element symbol means the amount of the element). Typically, carbon atoms and oxygen atoms in the silicon-based surface coating layer detected by XPS are preferably bonded to silicon atoms. The presence of both peaks corresponding to Si—O bond energy (104 eV and 532 eV) and Si—C bond energy (100 eV and 283 eV) in the chart of the XPS measurement allows confirmation of the bonding state. The XPS measurement can be performed on the silicon-based surface coating layer immediately after the coating layer is formed on the copper foil. Furthermore, in the form of printed wiring boards or electronic components manufactured with the surface-treated copper foil according to the present invention, exposure of the silicon-based surface coating layer of the surface layer of the insulating layer located beneath the wiring pattern allows the content measurement and confirmation of the bonding state, which will be described later.

Figure 6A:
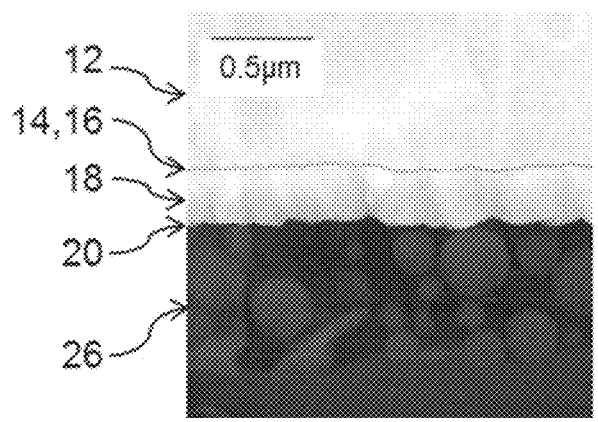
FIG. 6A is a TEM-EDX image of interfaces defined by a carrier 12, a refractory metal layer 14, a release layer 16, an extremely thin copper foil layer 18, a silicon-based surface coating layer 20 and a resin substrate 26 in the cross section of the copper-clad laminate containing a copper foil provided with a carrier according to the present invention.
Figure 6B:
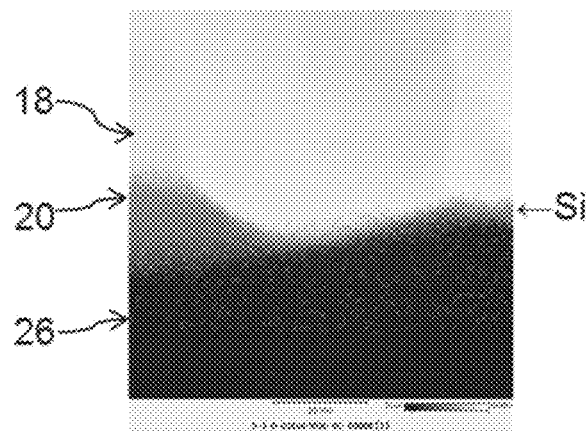
FIG. 6B illustrates an enlarged image of interfaces defined by an extremely thin copper foil layer 18, a silicon-based surface coating layer 20 and a resin layer 26 shown in FIG. 6A, and a Si element mapping by EDX superimposed on the image.

The silicon-based surface coating layer has a thickness in the range of preferably 0.1 to 100 nm, more preferably 2 to 100 nm, still more preferably 2 to 20 nm, particularly preferably 4 to 10 nm. The thickness within such a range can significantly enhance the adhesion to the resin layer and also insulation resistance. This thickness is measured by analyzing the cross section of the layer with transmission electron microscopy-energy dispersive X-ray spectrometer (TEM-EDX). For reference, FIG. 6A illustrates an image, observed with TEM-EDX, of the interfaces defined by a carrier 12, a refractory metal layer 14, a release layer 16, an extremely thin copper foil layer 18, a silicon-based surface coating layer 20 and a resin substrate 26 in the cross section of the copper-clad laminate provided with a carrier 25 including the surface-treated copper foil of the present invention. Furthermore. FIG. 6B illustrates an enlarged image of interfaces defined by an extremely thin copper foil layer 18, a silicon-based surface coating layer 20 and a resin layer 26 shown in FIG. 6A and a Si element mapping by EDX superimposed on the image. Such an image allows the confirmation of the presence and the thickness of the silicon-based surface coating layer 20 on the surface of the extremely thin copper foil layer 18.

Method for Manufacture

The surface-treated copper foil according to the present invention can be manufactured as follows: the copper foil described above is provided, on at least one surface of which a silicon-based surface coating layer mainly composed of silicon (Si) and having a carbon content of 1.0 to 35.0 atomic % and an oxygen content of 12.0 to 40.0 atomic % relative to a total content in 100 atomic % of the carbon (C), oxygen (O) and silicon (Si) elements as measured by X-ray photoelectron spectroscopy (XPS) is formed by vapor deposition. As described above, silicon-based surface coating layers may be formed on two surfaces of the copper foil, if desired.

The copper foil used in the present invention can be manufactured in any manner, as described above in more detail. Particularly preferred is a copper foil manufactured by physical vapor deposition, for example, sputtering because the resulting copper foil is extremely thin (e.g., 1 μm or less in thickness) and is suitable to meet a fine pitch. The most preferred is a copper foil manufactured by sputtering deposition. Such a copper foil is preferably provided in the form of a copper foil provided with a carrier.

In the method of manufacture according to the present invention, the silicon-based surface coating layer is formed by vapor deposition. The vapor deposition may be either physical vapor deposition or chemical vapor deposition. The vapor deposition can readily control the content of oxygen and/or carbon and form an extremely thin film (0.1 to 100 nm) suitable for the silicon-based surface coating layer. Thus, a silicon-based surface coating layer having a carbon content of 1.0 to 35.0 atomic % and an oxygen content of 12.0 to 40.0 atomic % can be preferably manufactured.

The silicon-based surface coating layer is preferably formed by physical vapor deposition. Examples of the physical vapor deposition include sputtering, vacuum deposition, and ion plating, most preferably sputtering. The sputtering can form an extremely thin silicon-based surface coating layer in a significantly good state without impairing the smoothness (preferably having an arithmetic mean roughness Ra of 200 nm or less). The structure such as a copper foil 10 provided with a carrier as shown in FIG. 1 has an advantage of significantly improved efficiency of manufacturing because all of the refractory metal layer 14, the release layer 16, the extremely thin copper foil layer 18, and the silicon-based surface coating layer 20 on a carrier 12 can be formed by sputtering.

It is preferred that the physical vapor deposition be performed in the presence of a carbon source and an oxygen source using a silicon target and/or silicon carbide target. In this case, the carbon source is preferably at least one gas selected from the group consisting of methane, ethane, propane, butane, acetylene, and tetraethoxysilane, more preferably methane or carbon dioxide ($CO_2$). Furthermore, the oxygen source is preferably at least one gas selected from the group consisting of carbon dioxide ($CO_2$), oxygen ($O_2$), nitrogen dioxide ($NO_2$), water vapor ($H_2O$), and nitrogen monoxide (NO), most preferably carbon dioxide ($CO_2$) or water vapor ($H_2O$). However, when carbon dioxide ($CO_2$) is used as the carbon source, the oxygen source is preferably water vapor ($H_2O$).

The physical vapor deposition can be performed under any known condition in any known physical vapor deposition system. For example, if sputtering is used, then any of various known sputtering techniques such as magnetron sputtering and bipolar sputtering can be used. Magnetron sputtering is preferred in view of high deposition rate and high productivity. Sputtering can be performed with a direct current (DC) supply or radio frequency (RF) supply. In the case of DC sputtering, a trace amount (e.g., 0.01 to 500 ppm) of conductive dopant such as boron is desirably added to a silicon target from the view point of improved film-forming efficiency. Furthermore, the ultimate vacuum within the chamber before the start of sputtering is preferably less than $1\times10^{-4}$ Pa. The gas used for sputtering includes inert gas such as argon gas, preferably in combination with other gas(es) such as the above-described carbon source and oxygen source. The most preferable gas is a combination of argon, methane and carbon dioxide. Gases such as argon gas can be supplied at any flow rate, which may be determined as appropriate according to dimensions of the sputtering camber and deposition conditions. The pressure during film deposition is preferably set in a range of 0.1 to 2.0 Pa from the view point of continuous formation of a stable film without operation failures such as abnormal discharge and plasma irradiation failure. This pressure range can be set by adjusting the electric power for film deposition and the flow rate of gases such as argon depending on the structure and volume of the device, the exhaust capacity of the vacuum pump, and the rated capacity of power supply for the film deposition. The sputtering power (per unit area of the target) can be appropriately determined within the range of 0.05 to 10.0 W/cm$^2$ from the view point of, for example, the uniform thickness and productivity of the film.

Copper-Clad Laminate for a Printed Wiring Board

According to a preferred aspect of the present invention, there is provided a copper-clad laminate for a printed wiring board including the surface-treated copper foil according to the present invention and a resin layer provided in close contact with the silicon-based surface coating layer. The surface-treated copper foil(s) can be provided on either one or two surfaces of the resin later.

The resin layer includes a resin, preferably an insulating resin. The resin layer is preferably a prepreg and/or a resin sheet. Prepreg is a general term for composite material which is formed such that a substrate, such as a synthetic resin plate, a glass plate, woven glass fabric, nonwoven glass fabric, and paper, is impregnated with a synthetic resin. Preferred examples of the insulating resin include epoxy resins, cyanate resins, bismaleimide triazine (BT) resins, poly(phenylene ether) resins, and phenolic resins. Examples of the insulating resin that constitutes the resin sheet include epoxy resins, polyimide resins, and polyester resins. Furthermore, the resin layer can contain filler particles composed of various inorganic fillers such as silica, and alumina from the view point of enhanced insulating property. The resin layer has any thickness, for example, preferably 1 to 1000 μm, more preferably 2 to 400 μm, even more preferably 3 to 200 μm. Resin layer may be composed of a plurality of layers. For examples, one outer layer prepreg may be provided on each surface of the inner prepreg (two on both sides in total) to constitute a resin layer. In this case, the inner layer prepreg may also consist of two or more layers. The resin layer such as a prepreg and/or a resin sheet is preferably provided on the surface-treated copper foil through the primer resin layer applied in advance on the surface of the copper foil in view of the stable bonding strength and the surface scratch resistance of the copper foil.

Printed Wiring Board

The surface-treated copper foil according to the present invention is preferably used in the preparation of the printed wiring board. That is, according to the present invention, there is also provided a printed wiring board having a layer structure derived from the surface-treated copper foil. In this case, the printed wiring board includes a laminated layer structure including, in sequence, a resin layer, a layer mainly composed of silicon (Si) and having a carbon content of 1.0 to 35.0 atomic % and an oxygen content of 12.0 to 40.0 atomic % relative to a total content in 100 atomic % of the carbon (C), oxygen (O) and silicon (Si) elements as measured by X-ray photoelectron spectroscopy (XPS), and a copper layer. The layer composed mainly of silicon is derived from the silicon-based surface coating layer of the surface-treated copper foil according to the present invention, and the copper layer is derived from the copper foil of the surface-treated copper foil according to the present invention. The resin layer is as described above with respect to the copper-clad laminate. In any case, the printed wiring board can have any known layer configuration besides the surface-treated copper foil according to the present invention. In particular, adopting the surface-treated copper foil of the present invention allows for a smooth interface between the insulating layer and the wiring layer of the printed wiring board having an arithmetic mean roughness Ra (measured in accordance with JIS B 0601-2001) of preferably 200 nm or less, more preferably 1 to 175 nm, even more preferably 2 to 180 nm, especially preferably 3 to 130 nm, most preferably 5 to 100 nm, resulting in a printed wiring board having excellent fine wiring formability.

Specific examples of the printed wiring board include a single-sided or double-sided printed wiring board formed in such a manner that the surface-treated copper foil according to the present invention is bonded to one or two surfaces of the prepreg and cured into a laminate (CCL) to form a circuit; and multi-layered printed wiring board that are composed of these printed wiring boards. Other specific examples include a flexible printed wiring board, a COF, and a TAB tape, which are formed in such a manner that the surface-treated copper foil according to the present invention is formed on the resin film to from a circuit. Still other specific examples include a build-up wiring board and a direct-buildup-on-wafer. The build-up wiring board is formed in a manner described below. The above-described resin layer is applied on the surface-treated copper foil according to the present invention to form a resin-coated copper foil (RCC), which is laminated to the above-described printed board using the resin layer as an insulating bonding layer to form a circuit using the surface-treated copper foil as a whole or a part of the wiring layer by a technique such as a modified semi-additive process (MSAP) or subtractive process. The direct-buildup-on-wafer is formed in such a manner that lamination of the resin-coated copper foil on a semiconductor integrated circuit and formation of the circuit are alternately repeated. Other useful methods for forming a wiring board include a semi-additive method (SAP), which includes the steps of laminating the surface-treated copper foil of the present invention on the printed board using a resin layer as an insulating adhesive layer, etching off the surface-treated copper foil to expose the insulating adhesive, and then forming a wiring board. More advanced specific examples of the present invention include an antenna element formed in such a manner that the above-described resin-coated copper foil is laminated on a substrate to form a circuit; electronic material for a panel display or window glass formed in such a manner that the resin-coated copper foil is laminated on a glass sheet or a resin film through a bonding layer to form a circuit; and electromagnetic wave shielding film composed of the surface-treated copper foil according to the present invention coated with a conductive bonding agent.

EXAMPLES

The present invention will be described in further detail by the following examples.

Examples 1 to 8

(1) Preparation of a Copper Foil Provided with a Carrier

As shown in FIG. 1, a refractory metal layer 14, a release layer 16, an extremely thin copper foil layer 18, and a silicon-based surface coating layer 20 were formed in this order on a carrier 12 of electrodeposited copper foil to prepare a copper foil 10 provided with a carrier. The silicon-based surface coating layer 20 was formed according to the various conditions shown in Table 1. The detailed procedures are as follows.

(1a) Preparation of Carrier

An electrodeposited copper foil with a thickness of 18 μm and a glossy surface having an arithmetic mean roughness Ra of 60 to 70 nm (Mitsui Mining & Smelting Co.) was provided as a carrier foil 12. The carrier was cleaned by pickling. The pickling was performed by immersing the carrier in a diluted sulfuric acid solution having a sulfuric acid concentration of 150 g/l at a temperature of 30° C. for 30 sec to remove the surface oxide layer, followed by rinsing with water and drying.

(1b) Formation of Refractory Metal Layer

A titanium refractory metal layer 14 having a 10 nm equivalent thickness was formed on the glossy surface of the pickled carrier 12 (electrodeposited copper foil) by sputtering under the following conditions:

Apparatus: Winding type DC sputtering system (manufactured by ULVAC, Inc., SPW-155)
    Target: Titanium target having a size of 300 mm×1700 mm
    Ultimate vacuum Pu: less than $1\times10^{-4}$ Pa
    Sputtering pressure PAr: 0.1 Pa
    Sputtering power: 30 kW (5.88 W/cm²)

(1c) Formation of Release Layer

A release layer 16 of a carbon layer having a thickness of 2 nm was formed on the refractory metal layer 14 (titanium layer) by sputtering under the following conditions:

Apparatus: Winding type DC sputtering system (manufactured by ULVAC, Inc., SPW-155)
    Target: Carbon target having a size of 300 mm×1700 mm
    Ultimate vacuum Pu: less than $1\times10^{-4}$ Pa
    Sputtering pressure PAr: 0.4 Pa
    Sputtering power: 20 kW (3.92 W/cm²)

(1d) Formation of Extremely Thin Copper Foil Layer

An extremely thin copper foil layer 18 having a thickness of 250 nm was formed on the release layer 16 (carbon layer) by sputtering under the conditions described below. The resulting extremely thin copper foil layer had a surface with an arithmetic mean roughness (Ra) of 46 nm determined with a non-contact profilometer (NewView 5032, manufactured by Zygo Corp.).

Apparatus: Winding type DC sputtering system (manufactured by ULVAC, Inc., SPW-155)
    Target: Copper target having a diameter of 8 inches (203.2 mm)
    Ultimate vacuum Pu: less than $1\times10^{-4}$ Pa
    Gas: Argon gas (flow rate: 100 sccm)
    Sputtering pressure: 0.45 Pa
    Sputtering power: 1.0 kW (3.1 W/cm²)

(1e) Formation of Silicon-Based Surface Coating Layer

A silicon layer having a thickness of 6 nm was formed as a silicon-based surface coating layer 20 on the extremely thin copper foil layer 18 by sputtering under the conditions described below, resulting in a copper foil provided with a carrier.

Apparatus: Winding type DC sputtering system (manufactured by ULVAC, Inc., SPW-155)
    Target: silicon target having a diameter of 8 inches (203.2 mm) doped with 200 ppm boron
    Ultimate vacuum Pu: less than $1\times10^{-4}$ Pa
    Gas: argon gas (flow rate: 100 sccm), methane gas (flow rate: 0 to 3.0 sccm), carbon dioxide gas (flow rate: 0 to 1 sccm), steam gas (flow rate: 0 to 5.0 sccm)
    Sputtering pressure: 0.45 Pa
    Sputtering power: 250 W (0.8 W/cm²)

The contents of oxygen and carbon in the silicon layer were varied by controlling the flow rates of methane and carbon dioxide in the gas as shown in Table 1.

Elemental analysis was performed on the surface of the silicon-based surface coating layer 20 (silicon layer) by X-ray photoelectron spectroscopy (XPS) to determine contents (atomic %) of silicon, carbon, and oxygen relative to a total content in 100 atomic % of the detected silicon (Si), carbon (C), and oxygen (O) elements. This measurement was performed with an X-ray photoelectron spectroscopic (XPS) system (Quantum 2000, ULVAC-PHI Inc.) under the following conditions: Output: 40 W, X-ray source: Al (using a monochromator), X-ray beam diameter: 200 μm, Energy range: 0 to 1400 eV, Pass energy: 58.7 eV, Step: 1.0 eV, Measurement time: 5 min under surveying conditions. Quantitative determination of the target elements using the resulting survey spectra was performed by software for the relative sensitivity coefficient method. The orbitals corresponding to measured spectra of the target elements Si, C and O for quantitative measurement by XPS are 2p (3/2+1/2) for Si, 1s for C, and 1s for O. The contents of silicon, carbon, and oxygen were respective percentages (atomic %) of Si, C, O elements calculated based on a total content in 100 atomic % of the three elements of Si, C and O detected by XPS. Furthermore, Si—O bonds and Si—C bonds were confirmed by the presence of peaks corresponding to the Si—O bond energy (104 eV and 532 eV) and the Si—C bond energy (100 eV and 283 eV) in 2p orbital in the chart of XPS analysis. The results are shown in Table 1.

Furthermore, the surface of the silicon-based surface coating layer 20 (silicon layer) was subjected to elemental analysis by radio frequency glow discharge optical emitting surface analysis (GDS) to measure the silicon content in the silicon-based surface coating layer 20. This measurement was performed with a radio frequency glow discharge optical emitting surface analyzer (GDS) (manufactured by HORIBA, Ltd., product name JY-5000 RF). The results are shown in Table 1.

(2) Preparation of Copper-Clad Laminate

Figure 2:
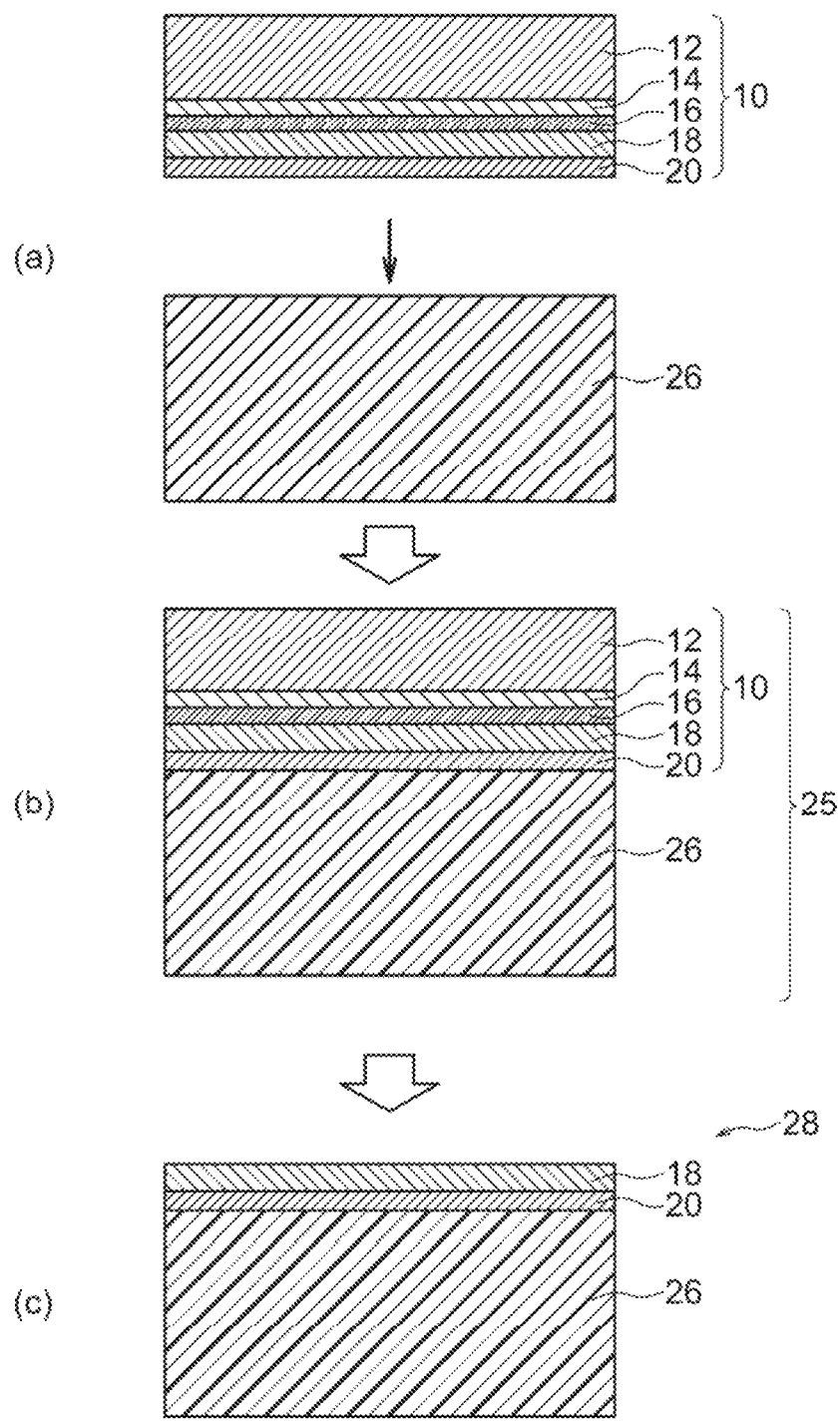
FIG. 2 is a flow diagram illustrating a process of manufacturing a copper-clad laminate in Examples 1 to 8.

As shown in FIG. 2, a copper-clad laminate 28 was prepared from the copper foil 10 provided with a carrier and a resin substrate 26 as follows.

(2a) Preparation of Resin Substrate

Four prepreg sheets made of a bismaleimide triazine resin containing glass cloth (manufactured by Mitsubishi Gas Chemical Company Inc., GHPL-830NS, thickness: 45 μm) were laminated to prepare the resin substrate 26.

(2b) Lamination

The two sides of the resin substrate 26 were sandwiched by the copper foils 10 provided with carriers (in FIG. 2, only one side of the laminate is shown for simplicity) and the resin substrate 26 and the copper foils 10 provided with carriers are laminated under the conditions of a press temperature of 220° C., a press time of 90 min, and a pressure of 40 MPa, resulting in a copper-clad laminate 25 provided with a carrier.

(2c) Release of Carrier

The carrier 12 was released manually from the release layer 16 of the copper-clad laminate 25 provided with a carrier to expose the surface of the extremely thin copper foil layer 18. The refractory metal layer 14 and the release layer 16 were removed together with the carrier 12 (electrodeposited copper foil) when the carrier 12 was released, resulting in the copper-clad laminate 28.

(3) Evaluation

The resulting copper-clad laminate was subjected to (3a) evaluation of peel strength, (3c) evaluation of formed fine wiring pattern, and (3d) interfacial observation and element mapping analysis by TEM-EDX. Furthermore, an equivalent of the silicon-based surface coating layer of the copper-clad laminate was prepared and subjected to (3b) evaluation of insulation resistance of the silicon-based surface coating layer. The detailed procedures are as follows.

(3a) Evaluation of Peel Strength

Figure 3:
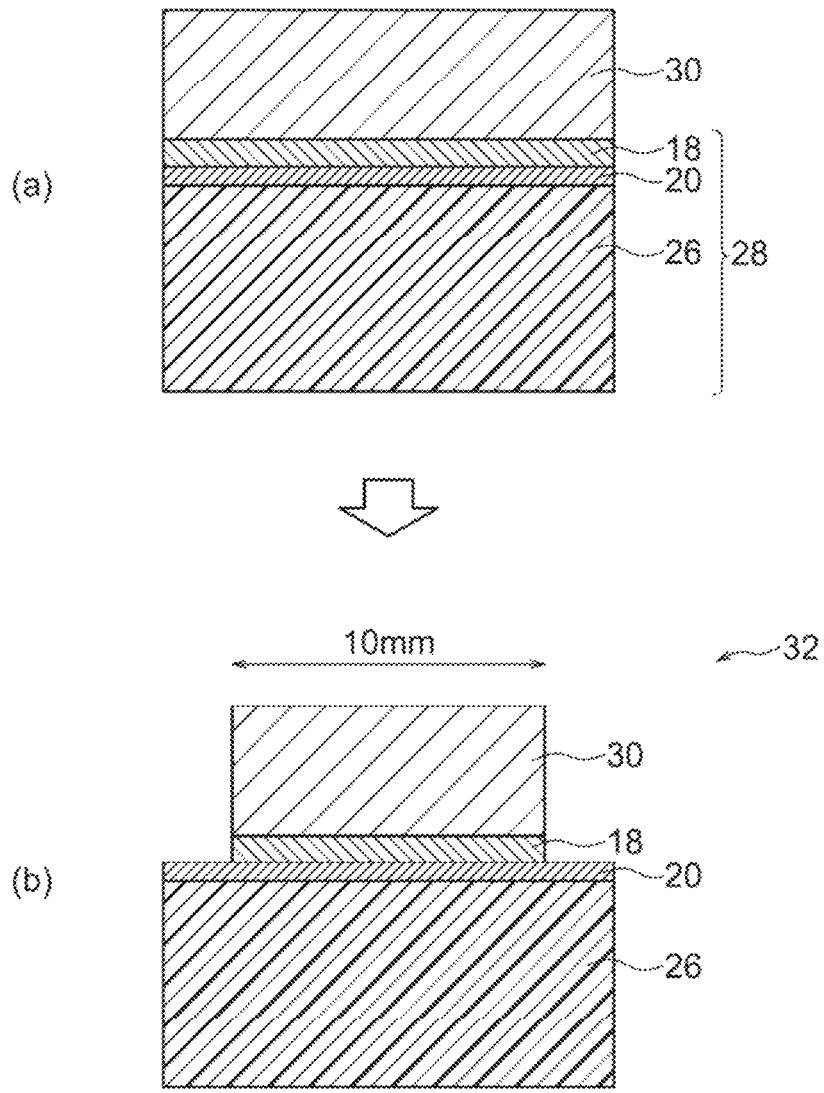
FIG. 3 is a flow diagram illustrating a process of manufacturing a sample for measurement of peel strength in Examples 1 to 8.

As shown in FIG. 3, a sample 32 was prepared with the copper-clad laminate 28 to evaluate the peel strength of the extremely thin copper foil layer 18 from the silicon-based surface coating layer 20 and the resin substrate 26. An electrolytic copper plating 30 having a thickness of 18 μm was formed on the copper-clad laminate 28 in a copper sulfate plating solution followed by pattern formation to prepare the sample 32 for measurement of peel strength. The pattern was formed as follows: the resulting electrodeposited copper plating was masked with a mask having a width of 10 mm and was etched with aqueous cupric chloride solution.

The peel strength was defined as the average peeling strength measured at three points under the conditions of an angle of 90 degrees and a rate of 50 mm/min. The resulting peel strength (average) was shown in Table 1.

3b) Evaluation of Insulation Resistance of Silicon-Based Surface Coating Layer

Samples of the silicon-based surface coating layers corresponding to Examples 1 to 6 were prepared to evaluate insulation resistance. A silicon-based surface coating layer (silicon layer) having 100 nm was formed on a glass substrate (manufactured by Corning Inc. #1737) under the same conditions as described in "(1e) Formation of silicon-based surface coating layer" to prepare the samples for measurement of insulation resistance. The resulting samples were subjected to four-terminal sensing test using a semiconductor device analyzer (manufactured by Agilent Technologies. Inc., B1500A). The resulting specific resistance values ρ (Ω-cm) at the film thickness of 100 nm were converted into the values at 6 nm (ρ×100/6) (defined as sheet resistance (Ω/□)). The value of sheet resistance was used as an evaluation index of insulation resistance. The results are shown in Table 1.

TABLE 1

|  |  | Ex. 1* | Ex. 2 | Ex. 3 | Ex. 4 | Ex. 5* | Ex. 6* | Ex. 7 | Ex. 8 |
|---|---|---|---|---|---|---|---|---|---|
| Conditions for preparing silicon-based coating layer | Flow rate of $CH_4$ (sccm) | 0 | 0.1 | 1.0 | 2.0 | 3.0 | 0.1 | 2.0 | 2.0 |
|  | Flow rate of $CO_2$ (sccm) | 1.0 | 0.1 | 0.2 | 0.4 | 0.6 | 0 | 0 | 0.2 |
|  | Flow rate of $H_2O$ (sccm) | 0 | 0 | 0 | 0 | 0 | 0 | 1.0 | 1.0 |
|  | Total flow rate (sccm) | 1.0 | 0.2 | 1.2 | 2.4 | 3.6 | 0.1 | 3.0 | 3.2 |
| Compositions of silicon-based coating layer | Silicon content by GDS (at. %) | 45.0 | 82.8 | 65.3 | 41.8 | 33.6 | 87.3 | 45.2 | 50.5 |
|  | Silicon content by XPS (at. %) $100 \times Si/(Si + C + O)$ | 46.9 | 83.8 | 66.9 | 43.5 | 34.2 | 87.5 | 50.6 | 51.5 |
|  | Oxygen content by XPS (at. %) $100 \times O/(Si + C + O)$ | 43.1 | 15.0 | 21.1 | 25.3 | 27.5 | 11.7 | 19.7 | 21.1 |
|  | Carbon content by XPS (at. %) $100 \times C/(Si + C + O)$ | 10.0 | 1.2 | 12.0 | 31.2 | 38.3 | 0.8 | 29.7 | 27.4 |
|  | Si—O bond (104 eV, 532 eV) | Present | Present | Present | Present | Present | Absent | Present | Present |
|  | Si—C bond (100 eV, 283 eV) | Absent | Present | Present | Present | Present | Absent | Present | Present |
| Peel strength (gf/cm) Copper foil/substrate laminate |  | 65 | 352 | 460 | 415 | 65 | 209 | 450 | 460 |
| Sheet resistance (Ω/□) |  | $2 \times 10^{13}$ | $1.2 \times 10^{12}$ | $9.2 \times 10^{12}$ | $3.0 \times 10^{13}$ | $5.6 \times 10^{13}$ | $5.1 \times 10^{10}$ | $2.2 \times 10^{13}$ | $2.5 \times 10^{13}$ |

The symbol "*" indicates a comparative example.

(3c) Evaluation of Fine Wiring Pattern

Figure 4:
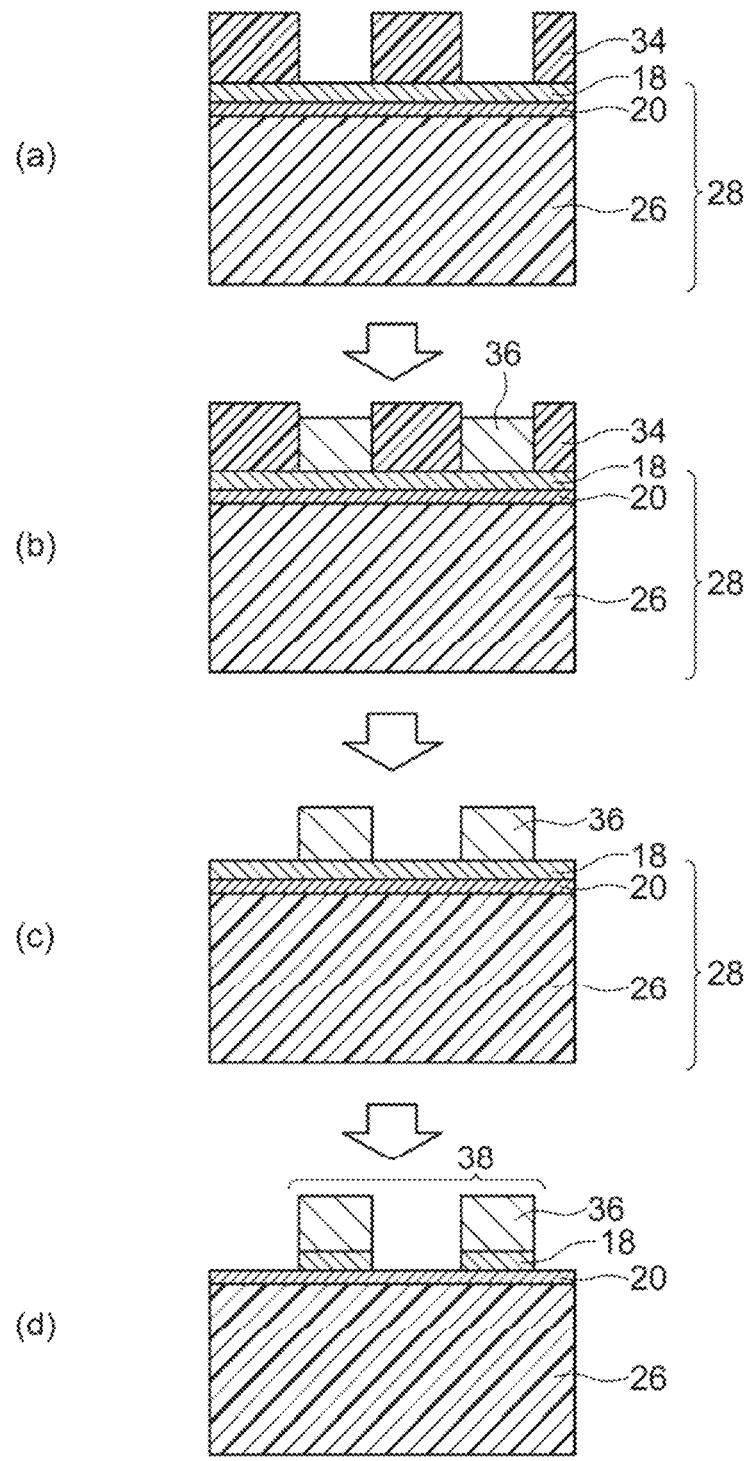
FIG. 4 is a flow diagram illustrating a process of forming a fine wiring pattern in Examples 1 to 8.

As shown in FIG. 4, pattern formability was evaluated by forming a fine wiring pattern 38 on the copper-clad laminate 28 prepared in Example 1 (Comparative) and Example 3 (Invention). Samples for evaluation of fine wiring patterning were formed as follows.

(i) Photoresist Coating

A positive photoresist (Tokyo Ohka Kogyo Co., Ltd., TMMRP-W1000T) was coated on an extremely thin copper foil layer 18 of the copper-clad laminate 28.

(ii) Exposure Treatment

The copper-clad laminate 28 coated with the photoresist was exposed under the conditions below.

Pattern: Line/Space=2 μm/2 μm, Length of pattern=2 mm

Glass mask: chromium evaporation mask

Exposure: 180 mJ/cm² (wavelength: 365 nm equivalent, mercury spectral line)

(iii) Development

The exposed copper-clad laminate 28 was developed under the conditions below to pattern the photoresist 34 as shown in FIG. 4(*a*).

Developer: aqueous TMAH solution (manufactured by Tokyo Ohka Kogyo Co., Ltd., NMD-3)
Temperature: 23° C.
Treatment: dip (1 min×2 times)

(iv) Electrolytic Copper Plating

An electrolytic copper plating 36 having a thickness of 2 µm was formed on the extremely thin copper foil layer 18 of the copper-clad laminate 28 having developed patterns using copper sulfate plating solution, as shown in FIG. 4 (*b*).

(v) Stripping of Photoresist

The photoresist 34 was stripped from the copper-clad laminate 28 having an electrolytic copper plating 36 under the following conditions into a state shown in FIG. 4 (*c*).

Stripping liquid: aqueous ST106 solution (manufactured by Tokyo Ohka Kogyo Co.)
Temperature: 60° C.
Time: 5 min (vi) Copper Etching (Flash Etching)

The copper-clad laminate 28 after stripping of the photoresist 34 was subjected to copper etching under the following conditions to form a fine wiring pattern 38 shown in FIG. 4 (*d*).

Figure 5:
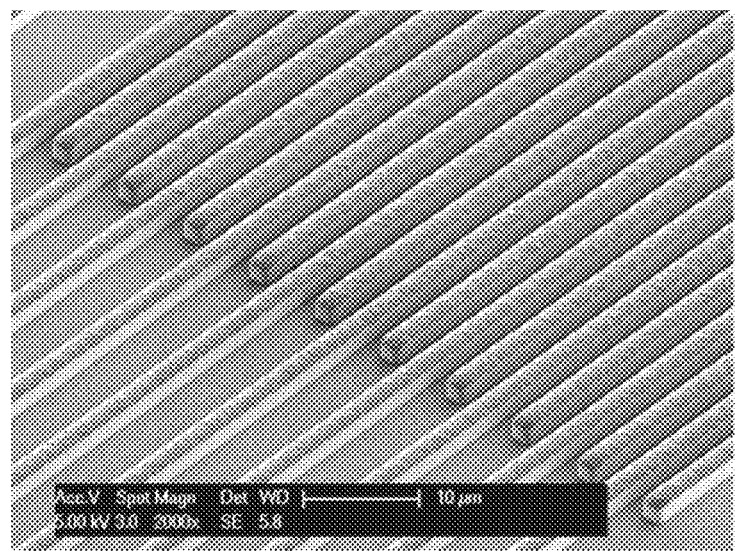
FIG. 5 is a SEM photograph of the fine wiring pattern observed in Example 3.

Etching solution: a mixture of sulfuric acid and hydrogen peroxide (manufactured by MEC Co., Ltd., QE7300)
Treatment: dip
Temperature: 30° C.
Time: 30 sec (vii) Microscopic Observation The appearance of the resulting fine wiring pattern was observed with an optical microscope (1750 magnifications) to evaluate the presence or absence of peeling of the wiring. The results indicate that peeling of the wiring was observed in Example 1 (Comparative), whereas peeling of the wiring was not observed in Example 3 (Invention). FIG. 5 shows an SEM photograph of the fine wiring pattern observed in Example 3 (Invention).

(3d) Interfacial Observation and Element Mapping Analysis by TEM-EDX

Interfaces defined by a carrier 12, a refractory metal layer 14, a release layer 16, an extremely thin copper foil layer 18, a silicon-based surface coating layer 20, and a resin substrate 26 in the cross section of the copper-clad laminate provided with a carrier 25 prepared in Example 3 (Invention) were observed by TEM-EDX. The enlarged image of the interfaces defined by the extremely thin copper foil layer 18, a silicon-based surface coating layer 20, and a resin substrate 26 was compared with the mapping image of Si to confirm that the silicon based surface coating layer 20 was formed on the extremely thin copper foil layer 18.

The invention claimed is:

1. A surface-treated copper foil comprising:
a copper foil having a width of 10 mm or more; and
a silicon-based surface coating layer provided on at least one surface of the copper foil,
the silicon-based surface coating layer being mainly composed of silicon (Si) and having a carbon content of 1.0 to 35.0 atomic % and an oxygen content of 12.0 to 40.0 atomic % relative to a total content in 100 atomic % of the carbon (C), oxygen (O) and silicon (Si) elements as measured by X-ray photoelectron spectroscopy (XPS).

2. The surface-treated copper foil according to claim 1, wherein the silicon content in the silicon-based surface coating layer is 40 to 87 atomic % as measured with a radio frequency glow discharge light emitting surface analyzer (GDS).

3. The surface-treated copper foil according to claim 1, wherein carbon atoms and oxygen atoms in the silicon-based surface coating layer are bonded to silicon atoms.

4. The surface-treated copper foil according to claim 1, being used for manufacturing a copper-clad laminate for a printed wiring board, wherein the manufacturing involves laminating a resin layer on the silicon-based surface coating layer.

5. The silicon-based surface coating layer according to claim 1, wherein the silicon-based surface coating layer have a thickness in the range of 0.1 to 100 nm.

6. The surface-treated copper foil according to claim 1, wherein the surface, adjacent to the surface coating layer, of the copper foil has an arithmetic mean roughness Ra of 200 nm or less measured in accordance with JIS B 0601-2001.

7. The surface-treated copper foil according to claim 1, wherein the silicon-based surface coating layer has a carbon content of 5.0 to 34.0 atomic %.

8. The surface-treated copper foil according to claim 1, wherein the silicon-based surface coating layer has an oxygen content of 20.0 to 35.0 atomic %.

9. The surface-treated copper foil according to claim 1, wherein the copper foil has a thickness of 50 to 3000 nm.

10. A copper-clad laminate for a printed wiring board, comprising the surface-treated copper foil according to claim 1 and a resin layer provided in close contact with the silicon-based surface coating layer.

11. A method for manufacturing a surface-treated copper foil according to claim 1, comprising:
providing a copper foil; and
forming a silicon-based surface coating layer being mainly composed of silicon (Si) and having a carbon content of 1.0 to 35.0 atomic % and an oxygen content of 12.0 to 40.0 atomic % relative to a total content in 100 atomic % of the carbon (C), oxygen (O) and silicon (Si) elements as measured by X-ray photoelectron spectroscopy (XPS) on at least one surface of the copper foil by vapor deposition.

12. The method according to claim 11, wherein the vapor deposition is performed by sputtering.

13. The method according to claim 12, wherein the sputtering is performed in the presence of a carbon source and an oxygen source using a silicon target and/or silicon carbide target.

14. The method according to claim 13, wherein the carbon source is at least one gas selected from the group consisting of methane, ethane, propane, butane, acetylene, and tetraethoxysilane.

15. The method according to claim 13, wherein the oxygen source is at least one gas selected from the group consisting of carbon dioxide ($CO_2$), oxygen ($O_2$), nitrogen dioxide ($NO_2$), and nitrogen monoxide (NO).

16. The surface-treated copper foil according to claim 1, wherein the oxygen content of the silicon-based surface coating layer is 12.0 to 35.0 atomic %.

17. A printed wiring board comprising the surface-treated copper foil according to claim 1.

* * * * *